(12) United States Patent
Lai et al.

(10) Patent No.: US 12,184,173 B2
(45) Date of Patent: Dec. 31, 2024

(54) PULSED-DC POWER GENERATOR AND METHOD OF AUTOMATICALLY ADJUSTING ARC EXTINCTION PARAMETERS

(71) Applicant: DELTA ELECTRONICS, INC., Taoyuan (TW)

(72) Inventors: Wei-Hsun Lai, Taoyuan (TW); Chien-Yu Wang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 301 days.

(21) Appl. No.: 17/713,603

(22) Filed: Apr. 5, 2022

(65) Prior Publication Data

US 2023/0126427 A1 Apr. 27, 2023

(30) Foreign Application Priority Data

Oct. 22, 2021 (CN) .......................... 202111233940.1

(51) Int. Cl.
*C23C 14/54* (2006.01)
*C23C 14/34* (2006.01)
*H02M 1/08* (2006.01)
*H02M 3/155* (2006.01)

(52) U.S. Cl.
CPC ......... *H02M 3/155* (2013.01); *C23C 14/3485* (2013.01); *C23C 14/3492* (2013.01); *C23C 14/54* (2013.01); *H02M 1/08* (2013.01)

(58) Field of Classification Search
None
See application file for complete search history.

(56) References Cited

U.S. PATENT DOCUMENTS

2009/0127101 A1\* 5/2009 Nauman ............... C23C 14/564
204/192.15
2021/0225622 A1\* 7/2021 Shoji ................. C23C 16/45536

FOREIGN PATENT DOCUMENTS

TW 202139571 A 10/2021

OTHER PUBLICATIONS

An Office Action in corresponding TW Application No. 110139239 dated Oct. 4, 2022 is attached, 4 pages.

\* cited by examiner

*Primary Examiner* — Jason Berman
(74) *Attorney, Agent, or Firm* — Muncy, Geissler, Olds & Lowe, P.C.

(57) ABSTRACT

A pulsed-DC power generator is used to sputter a substrate in a chamber, and the power generator includes a first voltage source, a second voltage source, a switch unit, a control unit, and a detection unit. The control unit provides a first control signal to control the switching of the switch unit to integrate a first voltage of the first voltage source and a second voltage of the second voltage source into a pulse voltage. The control unit adjusts parameters of a first predetermined time period for arc extinction when the pulse voltage is in a working time period of the first voltage, and the number that a voltage value of the first voltage in a voltage variation to be higher than a range is higher than the number of occurrence.

16 Claims, 8 Drawing Sheets

PULSED-DC POWER GENERATOR AND METHOD OF AUTOMATICALLY ADJUSTING ARC EXTINCTION PARAMETERS

BACKGROUND

Technical Field

The present disclosure relates to a power generator and an arc extinction method thereof, and more particularly to a pulsed-DC power generator and a method of automatically adjusting arc extinction parameters.

Description of Related Art

The statements in this section merely provide background information related to the present disclosure and do not necessarily constitute prior art.

In the present plasma system in the semiconductor process field (such as sputtering, etching, etc.), the present technology uses a negative voltage power supply and a positive voltage power supply proportional to its voltage as a pulse power output to periodically suppress the arc generated on the surface of the target. However, for applications that need to adjust the voltage level of the positive voltage power supply to meet different processes and sputtering materials, the conventional positive voltage with a fixed voltage ratio and pulse frequency output cannot effectively suppress the generation of arc, resulting in problems such as slow sputtering rate and poor film quality.

Please refer to FIG. 1, which shows a schematic waveform of occurring an arc in a conventional power generator. When an arc occurs (that is, at time t1, the voltage value of the pulse voltage Vp is rapidly changed), it represents that the energy transferred to the chamber is quickly leaked, that is, it is known that there is an arc in the chamber. Therefore, after a short delay (time t2), the pulse width modulation signal PWM that controls the output of the positive voltage power supply is turned to a high level for a time period (i.e., time t2 to time t3) to perform an arc extinction. However, after this time (time t3), the pulsed power supply returns to the original frequency and duty cycle output, which will cause a sharp change in the instantaneous current of the recovery, resulting in an excessive voltage (which can be called a surge or a recovery voltage) which is delivered to the chamber. The excessive voltage is likely to cause a second arc in the chamber, and the more arcs, the worse the quality of the film to be plated in the chamber. On the other hand, under fixed arc extinction parameters, when the arc cannot be effectively extinguished, there is a high probability that the arc will continue to occur, resulting in the inability to stabilize the quality of the film to be plated.

Therefore, the present disclosure is to design a pulsed-DC power generator and a method of automatically adjusting arc extinction parameters so that the pulse voltage will not generate an excessively high recovery voltage, which will cause the secondary arc situation.

SUMMARY

In order to solve the above-mentioned problems, the present disclosure provides a pulsed-DC power generator to sputter a substrate in a chamber. The power generator includes a first voltage source, a second voltage source, a second voltage source, a switch unit, a control unit, and a detection unit. The first voltage source generates a first voltage. The second voltage source generates a second voltage with a polarity opposite to the first voltage. The switch unit is coupled between the first voltage source and the second voltage source. The control unit is coupled to the switch unit, and provides a first control signal to control the switching of the switch unit so that the first voltage and the second voltage generate a pulse voltage at an output end. The detection unit is coupled to the output end and the control unit, and detects the pulse voltage at the output end. The control unit switches the pulse voltage to the second voltage for a first determined time period when the pulse voltage is in a working time period of the first voltage and a voltage variation of the first voltage is higher than a range.

In order to solve the above-mentioned problems, the present disclosure provides a method of automatically adjusting arc extinction parameters applied to a power generator to sputter a substrate in a chamber. The method includes steps of: providing a first control signal to control the switching of a switch unit of the power generator so that the power generator to integrate a first voltage and a second voltage with a polarity opposite to the first voltage into a pulse voltage: detecting the pulse voltage and determining the pulse voltage to be in a working time period of the first voltage, and a voltage variation of a voltage value of the first voltage is higher than a range: switching the pulse voltage to be a first determined time period of the second voltage to perform an arc extinction.

The main purpose and effect of the present disclosure is that the power generator automatically adjusts its appropriate arc extinction parameters according to the chamber environment, and after the arc extinction period is finished, the control unit provides a soft-start period for the power generation circuit to slowly start so that the current at the moment of recovery will not drastically change and cause excessive voltage to the output terminal, which in turn will cause the pulse voltage to produce excessively high surges.

It is to be understood that both the foregoing general description and the following detailed description are exemplary, and are intended to provide further explanation of the present disclosure as claimed. Other advantages and features of the present disclosure will be apparent from the following description, drawings and claims.

BRIEF DESCRIPTION OF DRAWINGS

The present disclosure can be more fully understood by reading the following detailed description of the embodiment, with reference made to the accompanying drawing as follows.

DETAILED DESCRIPTION

Figure 1:
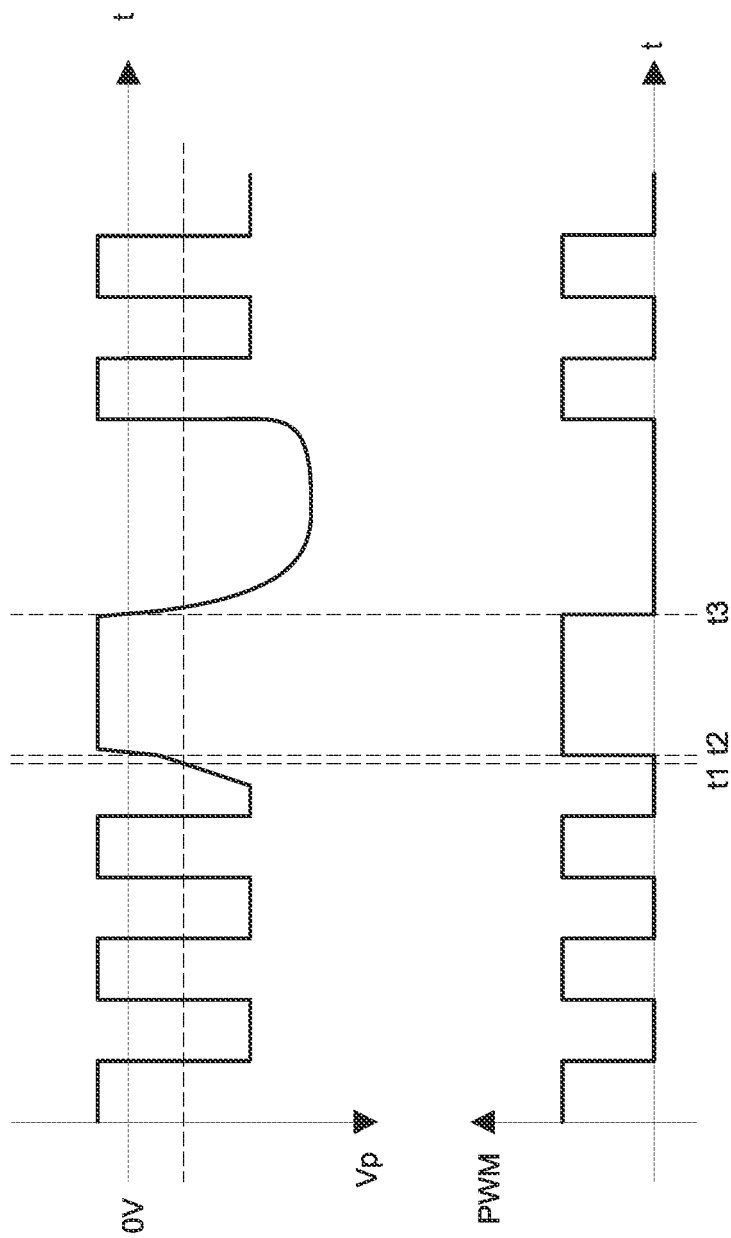
FIG. 1 is a schematic waveform of occurring an arc in a conventional power generator.

Reference will now be made to the drawing figures to describe the present disclosure in detail. It will be understood that the drawing figures and exemplified embodiments of present disclosure are not limited to the details thereof.

Figure 2:
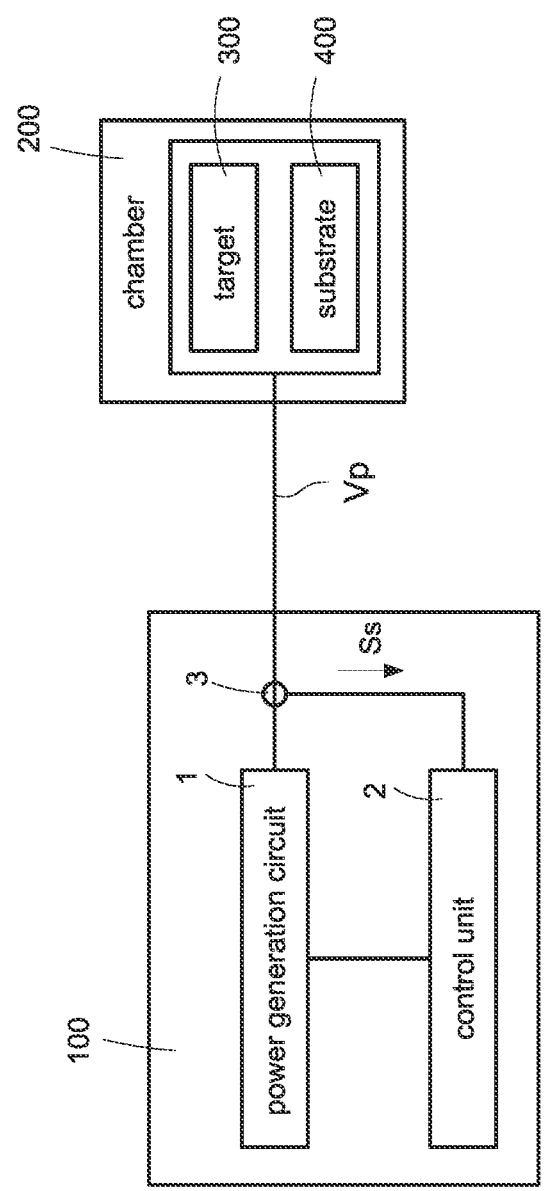
FIG. 2 is a block diagram of a pulsed-DC power generator according to the present disclosure.

Please refer to FIG. 2, which shows a block diagram of a pulsed-DC power generator according to the present disclosure, and also refer to FIG. 1. The power generator 100 provides a pulse voltage Vp to a chamber 200 so that the pulse voltage Vp sputters atoms on a target 300 in the chamber 200 onto a substrate 400. The power generator 100 includes a power generation circuit 1, a control unit 2, and a detection unit 3. The power generation circuit 1 provides the pulse voltage Vp to the chamber 200. The control unit 2 is coupled to the power generation circuit 1, and the detection unit 3 is coupled to an output end of the power generation circuit 1 and the control unit 2. The detection unit 3 detects the pulse voltage Vp (i.e., the actual voltage of the chamber 200) at the output end of the power generation circuit 1, and provides a detection signal Ss corresponding to the pulse voltage Vp to the control unit 2. The control unit 2 realizes the status of the pulse voltage Vp according to the detection signal Ss, and correspondingly controls the power generation circuit 1 according to the status of the pulse voltage Vp so as to sputter the substrate 400 in the chamber 200. In particular, the control unit 2 realizes whether there is an arc on the surface of the target 300 coupled to the output end of the power generation circuit 1 according to the detection signal Ss so as to automatically adjust parameters of controlling the power generation circuit 1.

Figure 3:
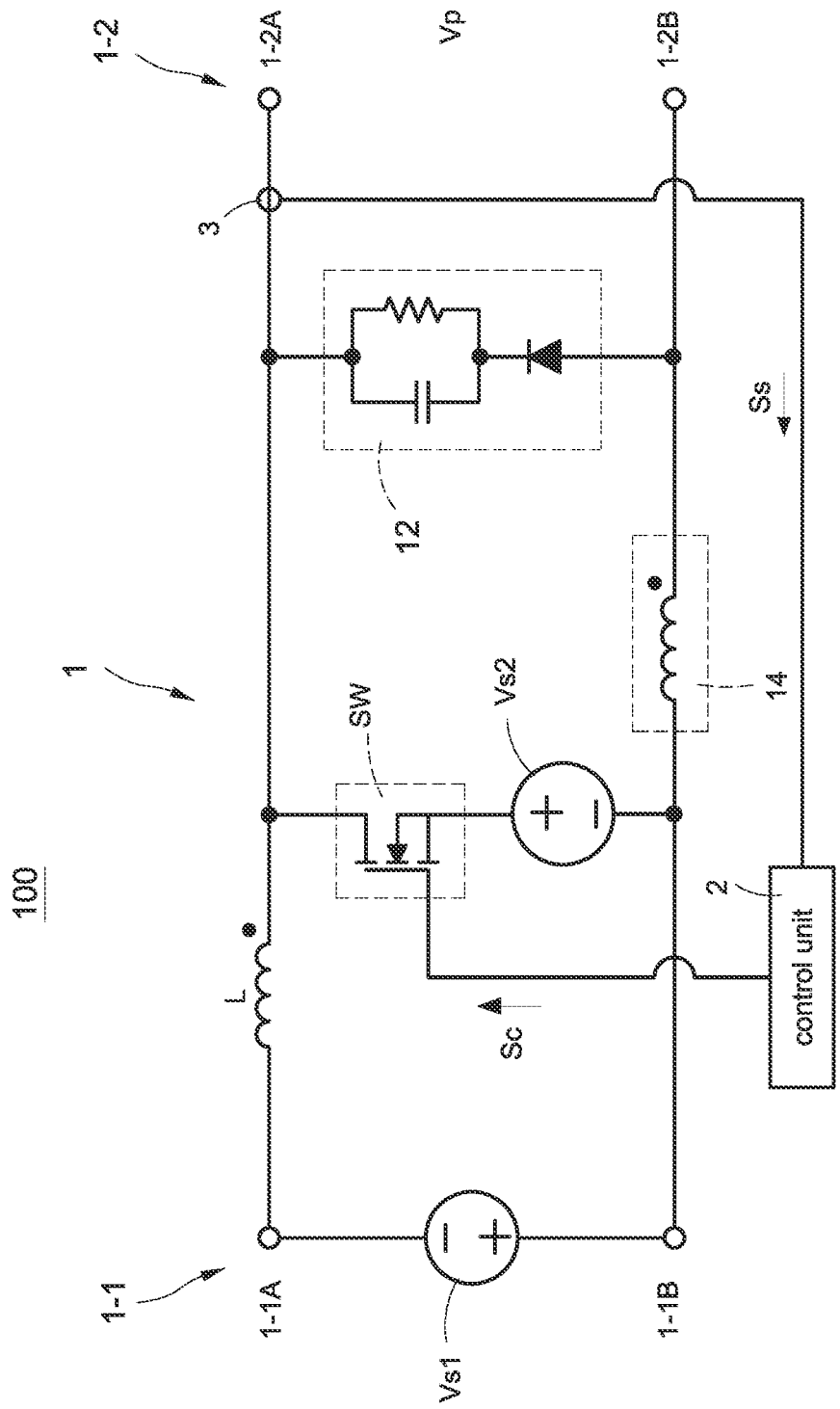
FIG. 3 is a circuit diagram of a power generation circuit according to the present disclosure.

Please refer to FIG. 3, which shows a circuit diagram of a power generation circuit according to the present disclosure, and also refer to FIG. 2. The power generation circuit 1 includes a first voltage source Vs1, a second voltage source Vs2, an inductor L, and a switch unit SW. The power generation circuit 1 further includes an input end 1-1 coupled to the first voltage source Vs1 and an output end 1-2 where it provides the pulse voltage Vp. The input end 1-1 has a first end 1-1A and a second end 1-1B, and the output end 1-2 has a third end 1-2A and a fourth end 1-2B. A first end of the inductor L is coupled to the first end 1-1A, and a second end of the inductor L is coupled to a first end of the switch unit SW and the third end 1-2A. A first end of the second voltage source Vs2 is coupled to a second end of the switch unit SW, and a second end of the second voltage source Vs2 is coupled to the second end 1-1B and the fourth end 1-2B. The control unit 2 is coupled to a control end of the switch unit SW, and the detection unit 3 is coupled to the third end 1-2A or the fourth end 1-2B to detect the pulse voltage Vp.

Specifically, the first voltage source Vs1 generates a first voltage, and the second voltage source Vs2 generates a second voltage with a polarity opposite to the first voltage. In FIG. 3, the polarities of the first voltage source Vs1 and the second voltage source Vs2 are shown for illustration only, and the polarities may be adjusted according to actual requirements. The control unit 2 provides a control signal, such as a pulse-width modulation signal PWM to control the switching of the switch unit SW so as to control the power generation circuit 1 to integrated the first voltage and the second voltage into the pulse voltage Vp. When the control unit 2 turns off the switch unit SW (in this embodiment, a single switch is shown), the first voltage provided by the first voltage source Vs1 is transmitted to the output end 1-2 so that a voltage value of the pulse voltage Vp is the first voltage. When the control unit 2 turns on the switch unit SW, the second voltage provided by the second voltage source Vs2 is transmitted to the output end 1-2 through the switch unit SW so that voltage value of the pulse voltage Vp is the second voltage. Therefore, the control unit 2 is mainly used to control the switching of the switch unit SW to integrate the first voltage and the second voltage into the pulse voltage Vp with positive polarity and negative polarity and the pulse voltage Vp is transmitted/passed through the third end 1-2A and the fourth end 1-2B to the chamber 200.

Take the polarities of the first voltage source Vs1 and the second voltage source Vs2 of this embodiment as an example, the first end 1-2A is coupled to the target 300 and the second end 1-2B is coupled to a shell/casing/housing (not shown) of the chamber 200. However, the actual coupling position depends on the material of the target 300 and the sputtering method, and is not limited here. In one embodiment, the switch unit SW is not limited to being a single switch as shown in FIG. 3, and it may be a switching circuit including a plurality of switches. In this condition, the control unit 2 provides a plurality of control signals Sc to control the switching circuit to generate the pulse voltage Vp. For example, all power generation circuits 1 that can integrate the pulse voltage Vp with positive polarity and negative polarity by the power switching method should be included within the scope of the present disclosure. In one embodiment, the control unit 2 may be implemented, for example, but not limited to, a control circuit composed of an analog circuit, or a controller containing a specific control program.

The power generation circuit 1 further includes a snubber circuit 12 and a surge suppression circuit 14. Specifically, a first end of the surge suppression circuit 14 is coupled to the second end of the second voltage source Vs2, and a second end of the surge suppression circuit 14 is coupled to the fourth end 1-2B. A first end of the snubber circuit 12 is coupled to the second end of the inductor L, and a second end of the snubber circuit 12 is coupled to the second end of the surge suppression circuit 14 and the fourth end 1-2B. The snubber circuit 12 is used to suppress the forward surge from the inductor L to the snubber circuit 12. The surge suppression circuit 14 is used to suppress bidirectional surges from the snubber circuit 12 to the surge suppression circuit 14 and from the second end of the second voltage source Vs2 to the surge suppression circuit 14. In particular, the snubber circuit 12 and the surge suppression circuit 14 are mainly used in the situation where high surges may occur when the switch unit SW is switched. When the surge generated by the power generation circuit 1 is low or there is no surge, the user may not use the snubber circuit 12 and the surge suppression circuit 14, or may use one according to actual needs.

Figure 4A:
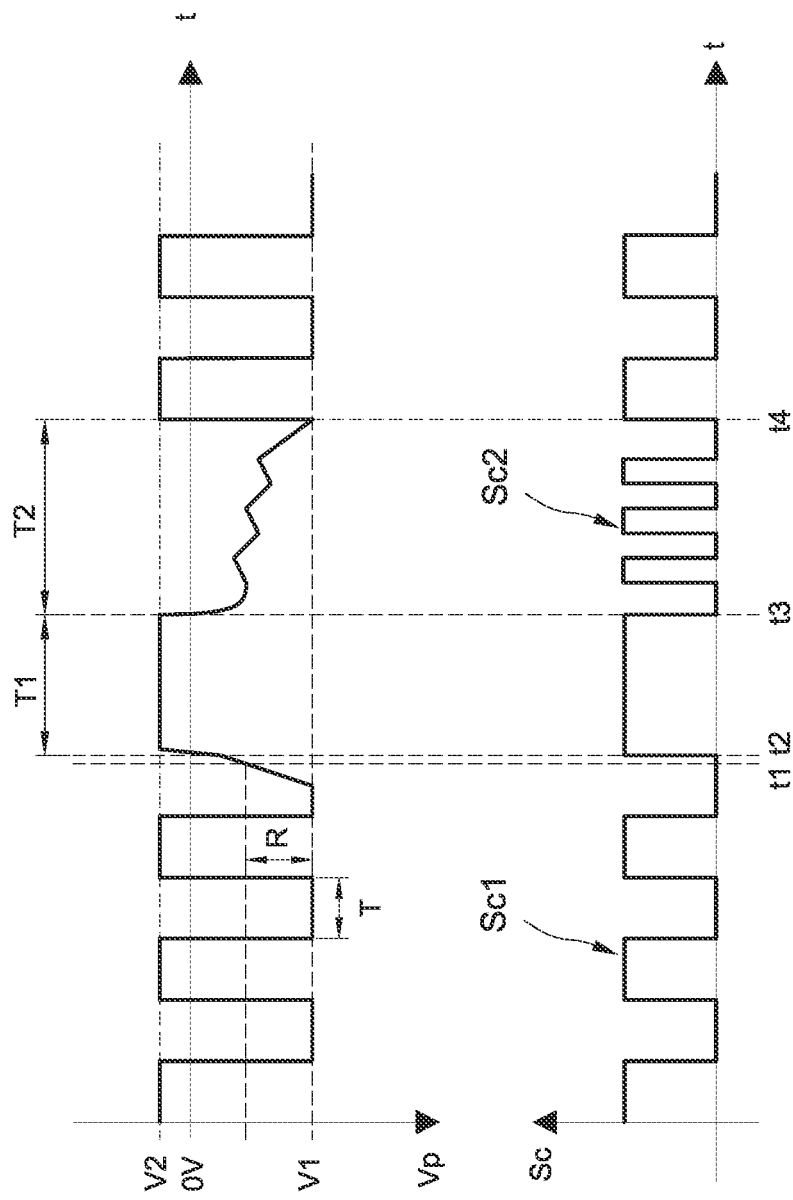
FIG. 4A is a schematic waveform of a soft-start control of the power generator according to a first embodiment of the present disclosure.

Please refer to FIG. 4A, which shows a schematic waveform of a soft-start control of the power generator according to a first embodiment of the present disclosure, and also refer to FIG. 1 to FIG. 3. After the power generation circuit 1 is started, i.e., before time t1, the control unit 2 provides the first control signal Sc1 to control the switching of the switch unit SW so that the output end 1-2 provides the pulse voltage Vp in which the first voltage V1 (provided by the first voltage source Vs1) and the second voltage V2 (provided by the second voltage source Vs2) are interleaved. In FIG. 4A, the direction of the ordinate arrow of the pulse voltage Vp only indicates that the sputtering process is performed by the first voltage V1. The control unit 2 continuously detects the status of the pulse voltage Vp at the output end 1-2 by the detection unit 3 so as to realize whether there is an arc on the surface of the target 300 coupled to the output end 1-2. The control unit 2 sets the pulse voltage Vp to be in the predetermined working time T of the first voltage V1. When the control unit 2 realizes that the pulse voltage Vp is in the predetermined working time T of the first voltage V1 according to the detection signal Ss, and a voltage variation of a voltage value of the first voltage V1 is higher than a determined range R (i.e., a range of a voltage difference), it represents that the arc generates on the surface of the target 300.

Afterward, after a short delay (i.e., time t2), the control unit 2 turns on the switch unit SW for a first predetermined time period T1 (i.e., time t2 to time t3) to provide the second voltage V2 for arc extinction of the chamber 200. Therefore, the first predetermined time period T1 may represent the arc extinction time period during which the arc extinction of the chamber 200 is performed. After the first predetermined time period T1 ends (i.e., time t3), the control unit 2 provides a second predetermined time period T2 (i.e., time t3 to time t4) for soft start of the power generation circuit 1 so that the current on the inductor L will not drastically change at the moment of recovery and cause excessive voltage to the output end 1-2, which will cause the pulse voltage Vp to produce an excessively high surge situation. Therefore, the second predetermined time period T2 may represent the soft start period during which the soft start of the chamber 200 is performed. In order to avoid the secondary arc caused by the excessively high peak, the control unit 2 provides the second control signal Sc2 during the second predetermined time period T2 to control the switching of the switch unit SW to perform the start procedure.

Specifically, the first control signal Sc1 includes a first switching frequency and a first duty cycle, and the second control signal Sc2 includes a second switching frequency and a second duty cycle. The control unit 2 controls the switching frequency or the duty cycle of the second control signal Sc2 to be different from that of the first control signal Sc1 to achieve the soft start. In one embodiment, the control unit 2 controls the second switching frequency to be higher than the first switching frequency during the second predetermined time period T2, and controls the second duty cycle to be equal to the first duty cycle so that the pulse voltage Vp is gradually increased to avoid the situation where the arc is generated again and the surge of the pulse voltage Vp is too high. Finally, after the soft start ends (i.e., time t4), the control unit 2 adjusts the pulse-width modulation signal PWM from the second control signal Sc2 to the first control signal Sc1 so that the power generation circuit 1 continues the sputtering operation.

Figure 4B:
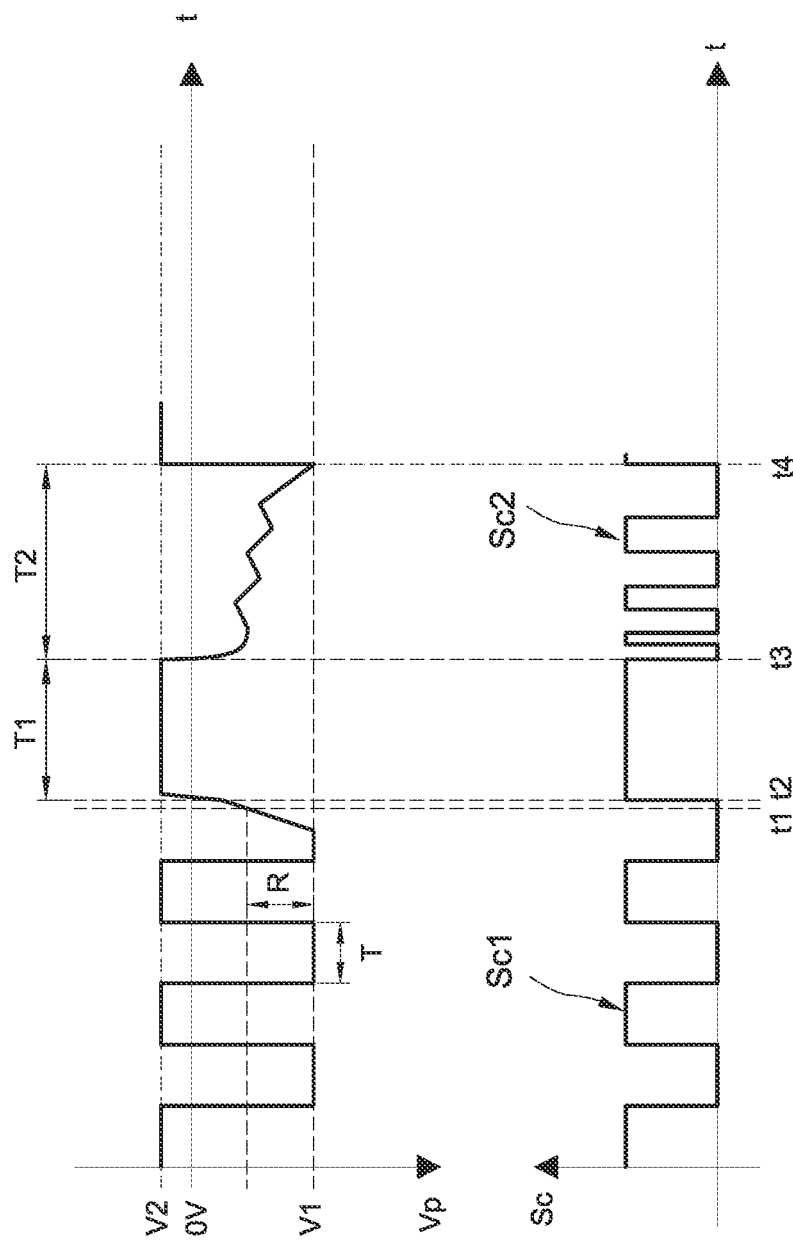
FIG. 4B is a schematic waveform of the soft-start control of the power generator according to a second embodiment of the present disclosure.

Please refer to FIG. 4B, which shows a schematic waveform of the soft-start control of the power generator according to a second embodiment of the present disclosure, and also refer to FIG. 1 to FIG. 4A. The difference between the embodiment in FIG. 4B and the embodiment in FIG. 4A is that the control method of the control unit 2 during the second predetermined time period T2. During the second predetermined time period T2, the control unit 2 controls the second switching frequency to be the same as the first switching frequency, and the second duty cycle is gradually increased from less than the first duty cycle to be equal to the first duty cycle. In one embodiment, the reason for the control unit 2 to control the soft start of the power generation circuit 1 is to avoid the situation where the arc is generated again due to the too-high surge caused by the pulse voltage Vp. Therefore, the number of pulses, frequency, and duty cycle generated by the second control signal Sc2 are not limited. For example, all control methods that can achieve surge suppression should be included within the scope of the present disclosure. In addition, the second predetermined time period T2 of FIG. 4B and the second predetermined time period T2 of FIG. 4A do not limit the time length of the second predetermined time period T2, which can be adjusted according to the requirements of the soft start control methods. Although one of the two embodiments of FIG. 4A and FIG. 4B only changes the "frequency" and the other only changes the "duty cycle", the present disclosure does not limit that only one of the two parameters or only the two parameters can be changed. That is, those skilled in the art may change at least one parameter according to the essence of the present disclosure, and the types of parameters are not limited to "frequency" and "duty cycle".

Figure 5A:
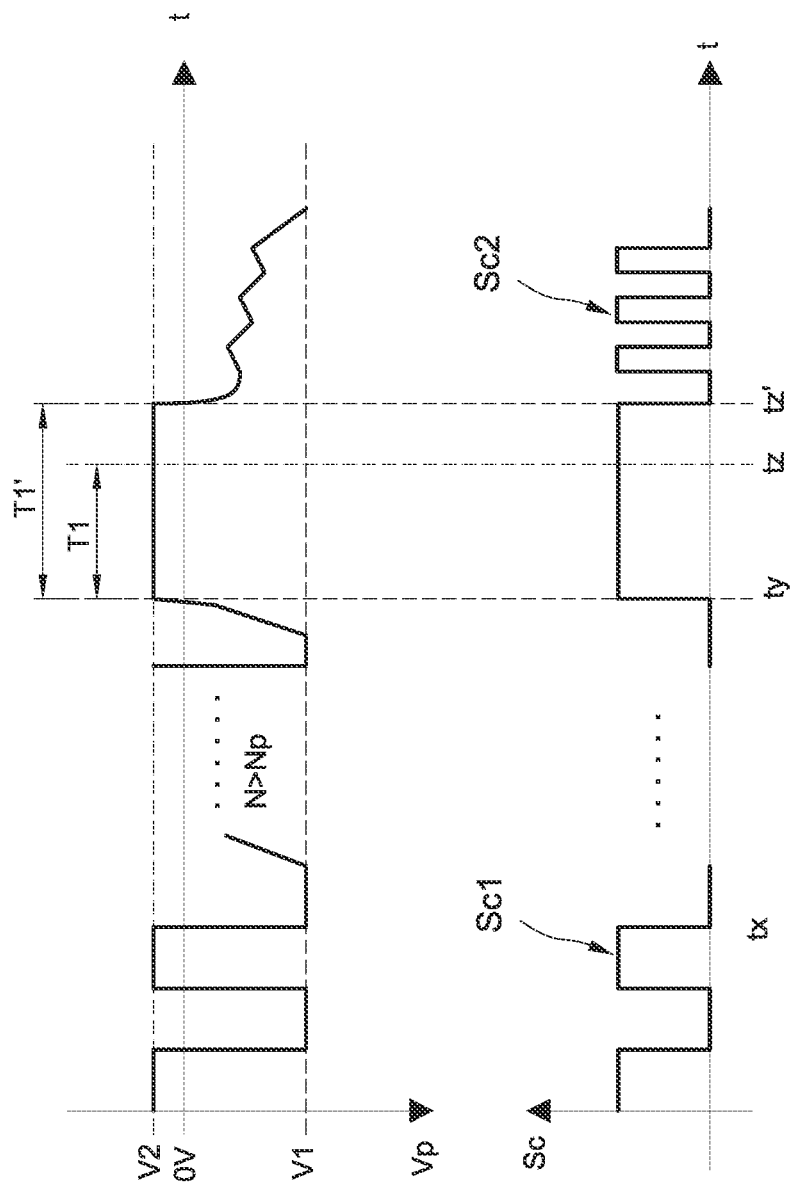
FIG. 5A is a schematic waveform of adjusting arc extinction parameters of the power generator according to a first embodiment of the present disclosure.

Please refer to FIG. 5A, which shows a schematic waveform of adjusting arc extinction parameters of the power generator according to a first embodiment of the present disclosure, and also refer to FIG. 2 to FIG. 4B. Under certain conditions, the energy of the arc cannot be completely dissipated, which will cause the phenomenon of continuous arcing after the arc extinction period, and the phenomenon may mean that the current arc extinction parameters cannot effectively and quickly extinguish the arc. Therefore, the present disclosure additionally provides an adjustment mechanism of arc extinction parameters for the first predetermined time period T1. Specifically, the control unit 2 is used to set a predetermined density, and the predetermined density is the number of occurrences Np of arcs in a unit time. According to the detection signal Ss, the control unit 2 determines and counts that the number N of the voltage variation of the first voltage V1 being higher than the range R is higher than the number of occurrences Np in the unit time when the pulse voltage Vp is in the working time period T of the first voltage V1, the control unit 2 adjusts the parameters of the first determined time period T1 to effectively and quickly extinguish the arc.

The predetermined density may be a variable or fixed parameter. For example, but not limited to, the counts of a fixed number of times within a fixed time period, where the actual number of arc occurrences exceeds a predetermined number of times, it is determined that the number of times N is higher than the number of occurrences Np. Alternatively, a specific number of times within a fixed time period is counted. For example, multiple conditions such as two occurrences within three milliseconds, and three occurrences within five milliseconds are integrated into a set of predetermined densities. As long as this condition is met, it is determined that the number of times N is higher than the number of occurrences Np.

In this embodiment, take the arc extinction parameter as the time length as an example. The control unit 2 increases the time length of the first predetermined time period T1 according to the number of times N is higher than the number of occurrences Np. As shown in FIG. 5A, the arc phenomenon occurred several times during time period tx-ty. The control unit 2 determines and counts that the number N of the voltage variation of the first voltage V1 being higher than the range R is higher than the number of occurrences Np in the unit time when the pulse voltage Vp is in the working time period T of the first voltage V1, the control unit 2 adjusts the time length of the first predetermined time period T1 to effectively and quickly extinguish the arc. That is, the original first predetermined time period T1 is from ty to tz, but since the control unit 2 determines that the number N of the voltage variation of the first voltage V1 being higher than the range R is higher than the number of occurrences Np, the control unit 2 adjusts the parameters of the arc extinction so that the end time of the first predetermined time period T1 is extended to change to tz', that is, the time length of the first predetermined time period T1 is extended to T1', thereby effectively and quickly extinguishing the arc.

Figure 5B:
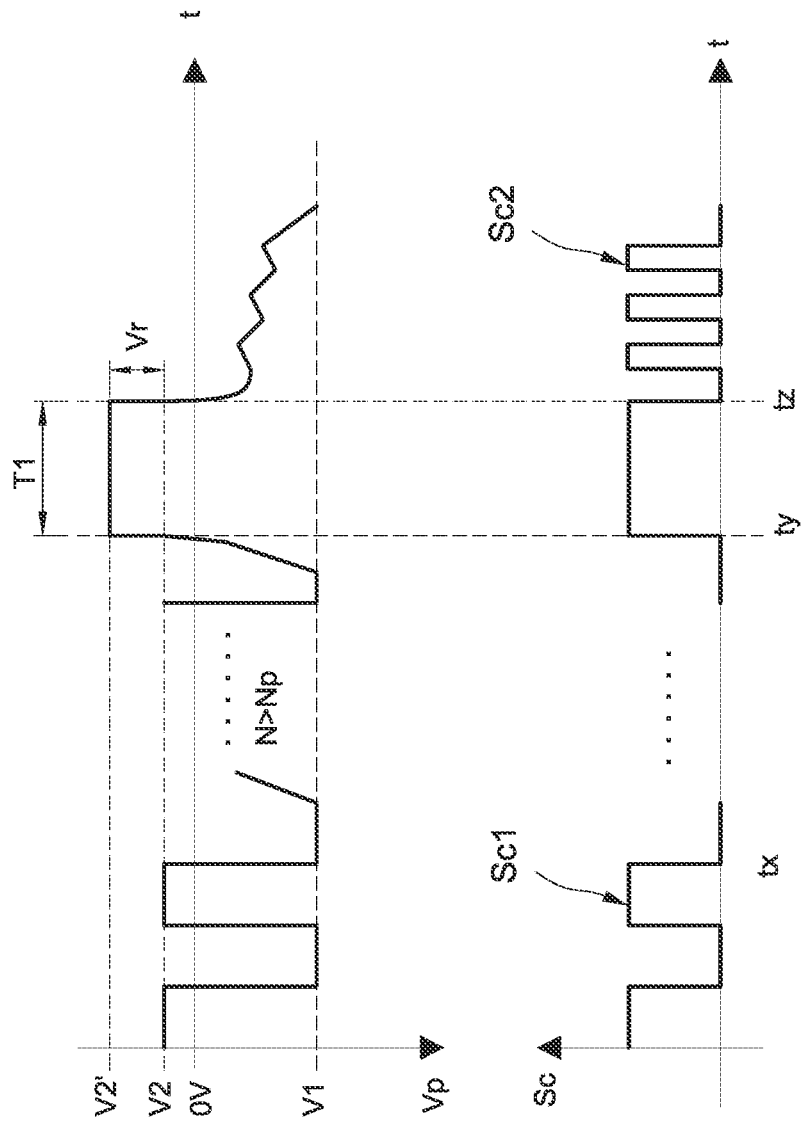
FIG. 5B is a schematic waveform of adjusting arc extinction parameters of the power generator according to a second embodiment of the present disclosure.

Please refer to FIG. 5B, which shows a schematic waveform of adjusting arc extinction parameters of the power generator according to a second embodiment of the present disclosure, and also refer to FIG. 2 to FIG. 5A. The difference between the embodiment of FIG. 5B and the embodiment of FIG. 5A is that the arc extinction parameter is voltage Vr. The control unit 2 additionally superimposes the voltage Vr according to that the number of times N is higher than the number of occurrences Np. Since the arc phenomenon occurred several times during time period tx-ty, and the control unit 2 determines that the number N of the voltage variation of the first voltage V1 being higher than the range R is higher than the number of occurrences Nh, the control unit 2 superimposes an additional voltage Vr on the second voltage V2 so as to effectively and quickly extinguish the arc. That is, the original pulse voltage Vp of the first predetermined time period T1 is the second voltage V2, but since the control unit 2 determines that the number N of the voltage variation of the first voltage V1 being higher than the range R is higher than the number of occurrences Np, the control unit 2 superimposes an additional voltage Vr on the second voltage V2 to be a voltage V2' so as to effectively and quickly extinguish the arc.

Figure 6:
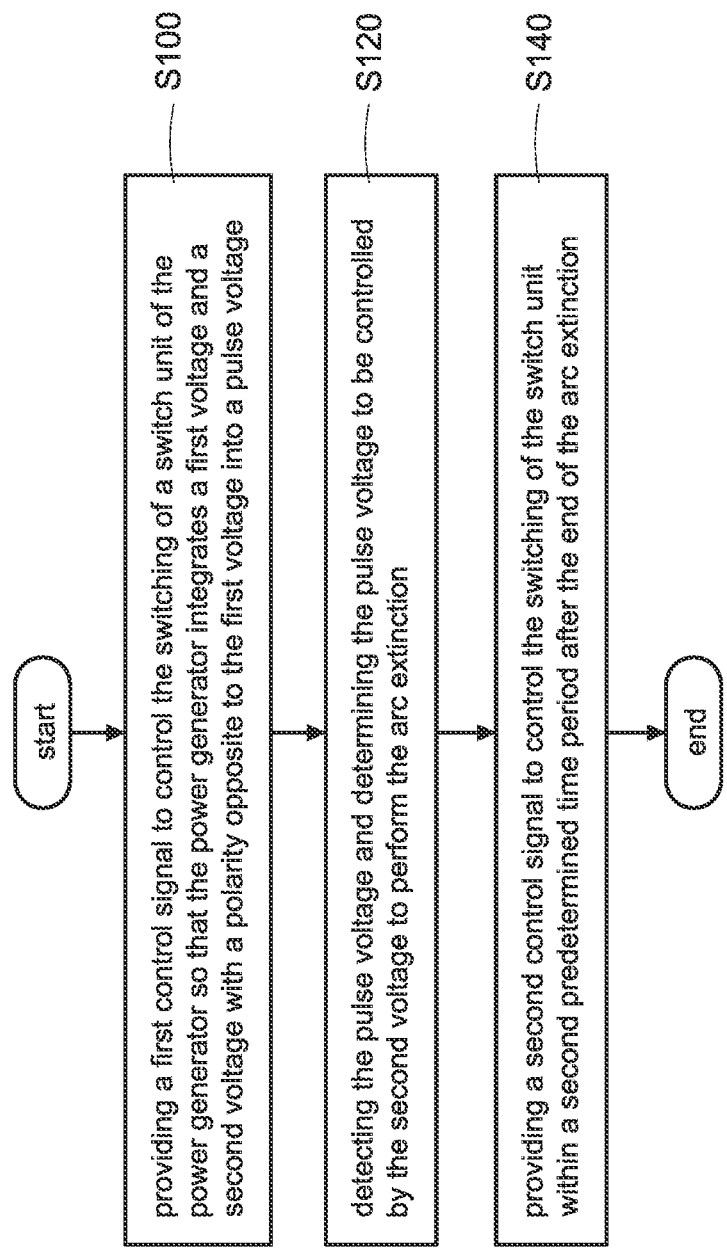
FIG. 6 is a flowchart of a method of automatically adjusting arc extinction parameters of a power generator according to the present disclosure.

Please refer to FIG. 6, which shows a flowchart of a method of automatically adjusting arc extinction parameters of a power generator according to the present disclosure, also refer to FIG. 2 to FIG. 5B. The method of automatically adjusting arc extinction parameters is applied to a power generator 100 to sputter a substrate 400 in a chamber 200. The method includes steps of: providing a first control signal to control the switching of a switch unit of the power generator so that the power generator integrates a first voltage and a second voltage with a polarity opposite to the first voltage into a pulse voltage (S100). The control unit 2 is used to provide the control signal Sc to control the switching of the switch unit SW so as to integrate the first voltage V1 generated from the first power voltage source Vs1 and the second voltage V2, which with a polarity opposite to the first voltage, generated from the second power source Vs2 into the pulse voltage Vp. When no arc occurs in the chamber 200, the control signal Sc of the control unit 2 is the first control signal Sc1.

Afterward, detecting the pulse voltage and determining the pulse voltage to be controlled by the second voltage to perform the arc extinction (S120). The generation conditions, determinations, and control manners of the arc are previously described in detail, and the detail description is omitted here for conciseness. The control unit 2 realizes the conditions of the pulse voltage Vp according to the detection signal Ss provided from the detection unit 3, and turns on the switch unit SW for a first predetermined time period T1 (i.e., time t2 to time t3 in FIG. 4A and FIG. 4B) when the arc generates so as to provide the second voltage V2 to extinguish the arc.

Finally, providing a second control signal to control the switching of the switch unit within a second predetermined time period after the end of the arc extinction (S140). After the first predetermined time period T1 ends, the control unit 2 provides the second predetermined time period T2 for soft start of the power generation circuit 1 so that the current on the inductor L will not drastically change at the moment of recovery and cause excessive voltage to the output end 1-2, which will cause the pulse voltage Vp to produce an excessively high surge situation. Therefore, the control signal Sc provided by the control unit 2 during the second predetermined time period T2 is the second control signal Sc2, and the second control signal Sc2 is provided to control the switching of the switch unit SW. The control unit 2 controls the switching frequency or the duty cycle of the second control signal Sc2 to be different from that of the first control signal Sc1 to achieve the soft start. For specific description, please refer to FIG. 4A and FIG. 4B, and the detail description is omitted here for conciseness. In one embodiment, the steps shown in FIG. 6 may include more detailed control manners, and the detailed content of the control method may be referred to FIG. 3 to FIG. 5B, which will not be described here. In one embodiment, the components described in FIG. 6 are not limited to be implemented only by the circuits in FIG. 2 to FIG. 3, and all circuits with the same functions, controllers with built-in programs, etc., should be included within the scope of the present disclosure.

In summary, the present disclosure has the following features and advantages:

1. The appropriate arc extinction parameters may be automatically adjusted according to the chamber environment so that the arc can be effectively and quickly extinguished, and it is especially suitable for sputtering of targets or oxides that are prone to arcing.

2. The soft start is used after the arc extinction period so that there is no risk of excessively high recovery voltage causing the probability of secondary arc (i.e., the arc is generated again) to increase.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. A pulsed-DC power generator configured to sputter a target in a chamber, the power generator comprising:
    a first voltage source configured to generate a first voltage,
    a second voltage source configured to generate a second voltage with a polarity opposite to the first voltage,
    a switch unit coupled between the first voltage source and the second voltage source,
    a control unit coupled to the switch unit, and configured to provide a first control signal to control the switching of the switch unit so that the first voltage and the second voltage generate a pulse voltage at an output end, and
    a detection unit coupled to the output end and the control unit, and configured to detect the pulse voltage at the output end,
    wherein the control unit determines that an arc is generated on the surface of the target when the pulse voltage is in a working time period of the first voltage and a voltage variation of the first voltage is higher than a range, and the control unit is configured to control the switch unit to switch the pulse voltage to the second voltage and maintain the second voltage for a first determined time period.

2. The power generator as claimed in claim 1, wherein the control unit is configured to provide a second control signal to control the switching of the switch unit in a second determined time period after the first determined time period, and a switching frequency or a duty cycle of the second control signal is different from that of the first control signal.

3. The power generator as claimed in claim 2, wherein the first control signal comprises a first switching frequency and a first duty cycle, and the second control signal comprises a second switching frequency and a second duty cycle; during the second determined time period, the control unit controls the second switching frequency to be the same as the first switching frequency, and controls the second duty cycle from less than the first duty cycle to be equal to the first duty cycle.

4. The power generator as claimed in claim 2, wherein the first control signal comprises a first switching frequency and a first duty cycle, and the second control signal comprises a second switching frequency and a second duty cycle; during the second determined time period, the control unit controls the second switching frequency to be higher than the first switching frequency, and controls the second duty cycle to be equal to the first duty cycle.

5. The power generator as claimed in claim 1, wherein the control unit sets a first number of occurrences within a unit time, and count a second number that the voltage variation of the pulse voltage higher than the range within the unit time; when the control unit determines that the second number is higher than the first number of occurrences, the control unit is configured to adjust a parameter of the first determined time period.

6. The power generator as claimed in claim 5, wherein the parameter is a time length; the control unit increases the time length of the first determined time period according to the second number being higher than the first number of occurrences.

7. The power generator as claimed in claim 5, wherein the parameter is a voltage; the control unit superimposes the voltage on the second voltage according to the second number being higher than the first number of occurrences.

8. The power generator as claimed in claim 2, wherein the control unit adjusts the second control signal back to the first control signal according to the end of the second determined time period.

9. A method of automatically adjusting arc extinction parameters applied to a power generator to sputter a target in a chamber, the method comprising steps of:
providing a first control signal to control the switching of a switch unit of the power generator so that the power generator to integrate a first voltage and a second voltage with a polarity opposite to the first voltage into a pulse voltage,
detecting that an arc is generated on the surface of the target when the pulse voltage is in a working time period of the first voltage, and a voltage variation of the first voltage is higher than a range, and
switching the pulse voltage to the second voltage and maintaining the second voltage for a first determined time period to perform an arc extinction.

10. The method of automatically adjusting arc extinction parameters as claimed in claim 9, further comprising a step of:
providing a second control signal to control the switching of the switch unit in a second determined time period after the first determined time period,
wherein a switching frequency or a duty cycle of the second control signal is different from that of the first control signal.

11. The method of automatically adjusting arc extinction parameters as claimed in claim 10, further comprising steps of:
controlling a second switching frequency of the second control signal to be the same as a first switching frequency of the first control signal, and
increasing a second duty cycle of the second control signal from a first duty cycle of the first control signal to be equal to the first duty cycle.

12. The method of automatically adjusting arc extinction parameters as claimed in claim 10, further comprising steps of:
controlling a second switch frequency of the second control signal to be higher than a first switching frequency of the first control signal, and
controlling a second duty cycle of the second control signal to be equal to a first duty cycle of the first control signal.

13. The method of automatically adjusting arc extinction parameters as claimed in claim 9, further comprising steps of:
setting a predetermined density, and the predetermined density is a first number of occurrences within a unit time,
counting a second number that the voltage variation of the pulse voltage higher than the range within the unit time,
determining that the second number be higher than the predetermined density, and
adjusting a parameter of the first determined time period.

14. The method of automatically adjusting arc extinction parameters as claimed in claim 13, wherein the parameter is a time length, and the method further comprises steps of:
determining that the second number is higher than the predetermined density, and
increasing the time length of the first determined time period.

15. The method of automatically adjusting arc extinction parameters as claimed in claim 13, wherein the parameter is a voltage, and the method further comprises steps of:
determining that the second number is higher than the predetermined density, and
superimposing the voltage on the second voltage.

16. The method of automatically adjusting arc extinction parameters as claimed in claim 10, further comprising steps of:
determining that the second determined time period being to end, and
adjusting the second control signal back to the first control signal.

* * * * *